United States Patent
Dirks et al.

(10) Patent No.: US 10,151,985 B2
(45) Date of Patent: Dec. 11, 2018

(54) PROCESS FLAGGING AND CLUSTER DETECTION WITHOUT REQUIRING RECONSTRUCTION

(71) Applicant: ASML NETHERLANDS B.V., Veldhoven (NL)

(72) Inventors: Remco Dirks, Deurne (NL); Seyed Iman Mossavat, Waalre (NL); Hugo Augustinus Joseph Cramer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/377,979

(22) Filed: Dec. 13, 2016

(65) Prior Publication Data

US 2017/0176869 A1    Jun. 22, 2017

(30) Foreign Application Priority Data

Dec. 18, 2015   (EP) ..................................... 15201233

(51) Int. Cl.
  *G03F 7/20*   (2006.01)
  *G06F 17/50*  (2006.01)

(52) U.S. Cl.
  CPC ...... *G03F 7/70508* (2013.01); *G03F 7/70533* (2013.01); *G03F 7/70633* (2013.01); *G03F 7/70641* (2013.01); *G06F 17/5081* (2013.01)

(58) Field of Classification Search
  CPC ................................................. G03F 7/70508
  USPC .......................................................... 716/52
  See application file for complete search history.

(56) References Cited

U.S. PATENT DOCUMENTS

| | | | |
|---|---|---|---|
| 7,065,423 B2 | 6/2006 | Prager et al. | |
| 7,076,320 B1* | 7/2006 | Phan | G03F 7/70525 356/394 |
| 7,523,021 B2 | 4/2009 | Vuong et al. | |
| 9,064,788 B1 | 6/2015 | Lu et al. | |
| 2006/0009872 A1 | 1/2006 | Prager et al. | |
| 2007/0105029 A1* | 5/2007 | Ausschnitt | B81C 99/0065 430/30 |
| 2013/0135600 A1 | 5/2013 | Middlebrooks et al. | |
| 2015/0046118 A1 | 2/2015 | Pandev et al. | |

(Continued)

FOREIGN PATENT DOCUMENTS

| | | |
|---|---|---|
| EP | 1 416 330 | 5/2004 |
| WO | 2014/074893 | 5/2014 |
| WO | 2015/049087 | 4/2015 |

OTHER PUBLICATIONS

David M. Blei et al., "Variational methods for the Dirichlet process", Proceedings of the 21st International Conference on Machine Learning, 8 pages (2004).

(Continued)

*Primary Examiner* — Suresh Memula
(74) *Attorney, Agent, or Firm* — Pillsbury Winthrop Shaw Pittman LLP

(57) ABSTRACT

A method including determining one or more statistical features from data obtained from a lithography process, a lithography apparatus, a substrate processed by the lithography process or the lithography apparatus, wherein determining the one or more statistical features does not include reconstructing a characteristic of the lithography process, of the lithography apparatus, or of the substrate.

20 Claims, 9 Drawing Sheets

(56) References Cited

U.S. PATENT DOCUMENTS

2015/0112649 A1* 4/2015 Agarwal ............... G06K 9/00
                                                                 703/2
2016/0025618 A1   1/2016 Ryu et al.
2016/0180003 A1*  6/2016 Greco ............... G06F 17/5081
                                                                 716/51

OTHER PUBLICATIONS

Bernhard Schölkopf et al., "Estimating the Support of a High-Dimensional Distribution", Neural Computation, Nov. 27, 1999; 31 pages.
Christopher M. Bishop, "Chapter 2: Probability Distributions", Pattern Recognition and Machine Learning, pp. 67-136 (2006).
Christopher M. Bishop, "Chapter 9: Mixture Models and EM", Pattern Recognition and Machine Learning, pp. 423-459 (2006).
Bei Yu, et al., "Accurate lithography hotspot detection based on principal component analysis-support vector machine classifier with hierarchical data clustering", Journal of Micro-nanolithography Mems and Moems, vol. 14, published online Nov. 4, 2014, pp. 011003-1-011003-.12.
"Expectation-maximization algorithm" printed from URL https://en.wikipedia.org/wiki/Expectation%E2%80%93maximization_algorithm, printed on Dec. 13, 2016, 12 pages.
International Search Report and Written Opinion dated Apr. 12, 2017 in corresponding International Patent Application No. PCT/EP2016/078762.
Taiwan Office Action dated Nov. 15, 2017 in corresponding Taiwan Patent Application No. 105141343.

* cited by examiner

PROCESS FLAGGING AND CLUSTER DETECTION WITHOUT REQUIRING RECONSTRUCTION

This application claims the benefit of priority of European Application No. 15201233.2, which was filed on Dec. 18, 2015. The content of the foregoing application is incorporated herein in its entirety by reference.

FIELD

The present disclosure relates to a method of flagging a process that does not satisfy a criterion, without the need of reconstructing from a set of measurement data a characteristic of the process or a characteristic of a product of the process. The present disclosure relates to a method of finding clusters from a set of measurement data without the need of reconstructing a characteristic of the process or a characteristic of a product of the process.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

SUMMARY

Characteristics of a substrate that underwent the lithography process, characteristics of the lithography process itself, or characteristics of the lithography apparatus used in the lithography process may be measured for various purposes such as improving or adjusting the lithography process, compensating certain errors caused by components in the lithography apparatus, and/or determining whether the substrate satisfies a criterion. The raw data from the measurements are often not the characteristics of interest, and the characteristics of interest may have to be "reconstructed" from the raw data. Reconstruction can be challenging because the relationship between the characteristics and the raw data can be complex or because the raw data do not include all information necessary to reconstruct the characteristics.

Disclosed herein is a method comprising: determining, using a computer, one or more statistical features from data obtained from a lithography process, a lithography apparatus, or a substrate processed by the lithography process or the lithography apparatus, wherein determining the one or more statistical features does not comprise reconstructing a characteristic of the lithography process, of the lithography apparatus, or of the substrate.

According to an embodiment, the data have more than one dimension.

According to an embodiment, the method further comprises reducing dimensions of the data.

According to an embodiment, reducing the dimensions comprises using principal component analysis (PCA), independent component analysis (ICA) and/or non-negative matrix factorization (NNMF).

According to an embodiment, the data comprise a diffraction pattern from a target on the substrate.

According to an embodiment, the data comprise intensities of diffraction peaks obtained from the diffraction pattern.

According to an embodiment, the data comprise overlay errors or focus errors.

According to an embodiment, the one or more statistical features are selected from: the median of the data, the mean of the data, the variance of the data, line edge roughness (LER) of patterns on the substrate, critical dimension uniformity (CDU) of patterns on the substrate, parameters of a probability distribution of the data, and/or any combination selected therefrom.

According to an embodiment, the one or more statistical features comprise a mixture model of the data.

According to an embodiment, determining the one or more statistical features comprises using expectation maximization (EM), Markov chain Monte Carlo (MCMC), moment matching, variational Bayes, Laplace posterior approximations, expected propagation or the spectral method.

According to an embodiment, the one or more statistical features comprise parameters of the mixture model.

According to an embodiment, the parameters comprise parameters of component distributions of the mixture model, or weights of the component distributions of the mixture model.

According to an embodiment, determining the one or more statistical features comprises identifying one or more clusters from the data.

According to an embodiment, the method further comprises training a classifier with a cluster among the one or more clusters.

According to an embodiment, the method further comprises training a classifier with the data.

According to an embodiment, the method further comprises making a decision using the one or more statistical features.

According to an embodiment, the decision is selected from: whether a criterion is satisfied; whether the substrate is defective; whether a change has occurred in the lithography process, the lithography apparatus, or the substrate; whether the lithography process, the lithography apparatus or the substrate is similar to a reference process, apparatus or substrate; and/or any combination selected therefrom.

According to an embodiment, the one or more statistical features comprise a support vector machine.

According to an embodiment, the support vector machine is single class.

Disclosed herein is a computer program product comprising a computer readable medium having instructions recorded thereon, the instructions when executed by a computer implementing any of the methods above.

DETAILED DESCRIPTION

Figure 1:
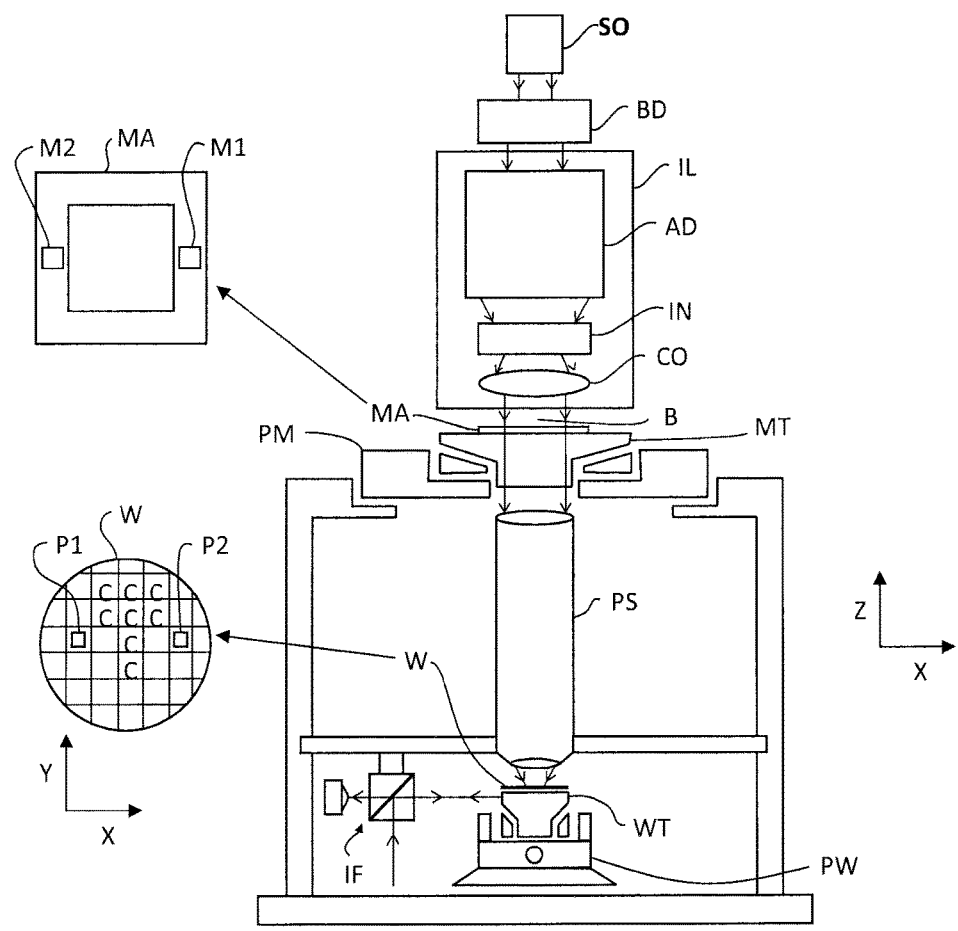
FIG. 1 schematically depicts a lithography apparatus according to an embodiment.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens."

FIG. 1 schematically depicts a lithography apparatus according to an embodiment. The apparatus comprises:

an illumination system (illuminator) IL to condition a beam PB of radiation (e.g. UV radiation or DUV radiation).

a support structure MT to support a patterning device (e.g. a mask) MA and connected to first positioning device PM to accurately position the patterning device with respect to item PL;

a substrate table (e.g. a wafer table) WT for holding a substrate (e.g. a resist coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithography apparatus may be separate entities, for example when the source is an excimer laser. In such cases, the source is not considered to form part of the lithography apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AM configured to adjust the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The projection system PL has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PL as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PL will have a different Zernike expansion for each field point (i.e. for each spatial location in its image plane). The relative phase of the projection system PL in its pupil plane may be determined by projecting radiation, for example from a point-like source in an object plane of the projection system PL (i.e. the plane of the patterning device MA), through the projection system PL and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PL. The interference pattern is related to the derivative of the phase of the radiation with respect to a coordinate in the pupil plane in the shearing direction. The detector may comprise an array of sensing elements such as, for example, charge coupled devices (CCDs).

The diffraction grating may be sequentially scanned in two perpendicular directions, which may coincide with axes of a co-ordinate system of the projection system PL (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The projection system PL of a state of the art lithography apparatus LA may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PL in its pupil plane may be determined by projecting radiation, for example from a point-like source in an object plane of the projection system PL (i.e. the plane of the patterning device MA), through the projection system PL and measuring the intensity of radiation in a plane that is conjugate to a pupil plane of the projection system PL, using a detector. The same detector as is used to measure the wavefront to determine aberrations may be used. The projection system PL may comprise a plurality of optical (e.g., lens) elements and may further comprise an adjustment mechanism PA configured to adjust one or more of the optical elements so as to correct for aberrations (phase variations across the pupil plane throughout the field). To achieve this, the adjustment mechanism PA may be operable to manipulate one or more optical (e.g., lens) elements within the projection system PL in one or more different ways. The projection system may have a co-ordinate system wherein its optical axis extends in the z direction. The adjustment mechanism PA may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric aspherical optical elements. Deformation of optical elements may include both low frequency shapes (e.g. astigmatic) and high frequency shapes (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PL to correct for apodizations (transmission variation across the pupil plane). The transmission map of a projection system PL may be used when designing a patterning device (e.g., mask) MA for the lithography apparatus LA. Using a computational lithography technique, the patterning device MA may be designed to at least partially correct for apodizations.

A measurement of a substrate that underwent the lithography process, of the lithography process itself, or of the lithography apparatus used in the lithography process may occur during or after the lithography process. For example, the substrate may be measured after it is exposed in the lithography apparatus such as that shown in FIG. 1. If the measurement indicates that the substrate is defective, the substrate may be salvaged by reworking it and thus does not decrease the yield of the lithography process. The data of the measurement may be used to determine the values of one or more characteristics of the lithography process, of the lithography apparatus, or of the substrate. This determination of the values of one or more characteristics from the data may be called "reconstruction" of the one or more characteristics. For example, the one or more characteristics may include critical dimension, sidewall angle, yield, process window, an optical attribute of the lithography apparatus, and/or the focus or dose at which a portion of the substrate is exposed.

Figure 2:
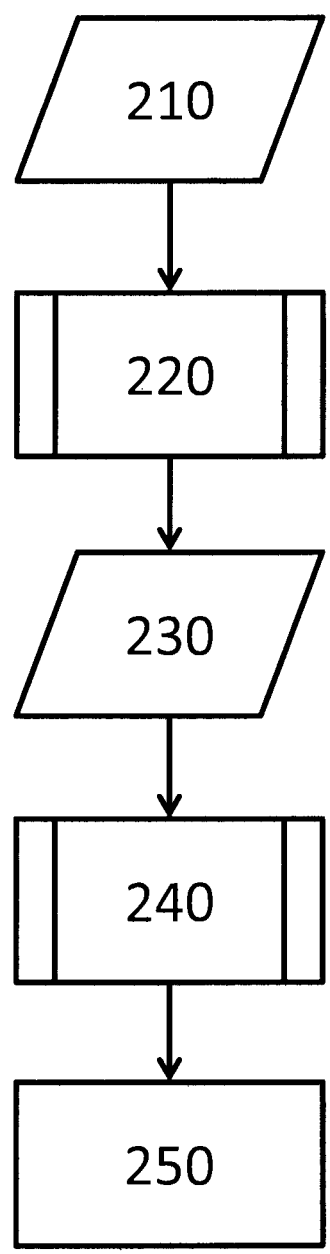
FIG. 2 schematically shows a flow of reconstruction.

FIG. 2 schematically shows a flow of reconstruction as an example. In 220, data 210 of a measurement are used to determine the values 230 of one or more characteristics of the lithography process, of the lithography apparatus, or of the substrate (i.e., data 210 used to reconstruct the one or more characteristics). The determination may be by using a model that links the data 210 and the one or more characteristics. The data 210 are not necessarily the raw data of the measurement but can be obtained from the raw data. For example, the measurement can be a diffraction based overlay measurement. The raw data of the diffraction based overlay measurement are a diffraction pattern from a target. The diffraction pattern is intensities of diffracted radiation from the target as a function of direction. The data 210 can be the raw data of the diffraction based overlay measurement, namely the diffraction pattern. The data 210 can alternatively be intensities of diffraction peaks obtained from the diffraction pattern. The one or more characteristics whose values 230 are determined from the data 210 can be overlay errors when the measurement is a diffraction based overlay measurement. The one or more characteristics can also be focus errors. In 240, the values 230 are used to make a decision 250, for example, whether a criterion is satisfied. One example of the decision 250 is whether the substrate is defective. Other examples of the decision 250 include whether the substrate or the lithography process satisfies a criterion, whether a change has occurred in the lithography process, the lithography apparatus or a substrate processed thereby, or whether the lithography process, the lithography apparatus or the substrate is similar to a reference process, apparatus or substrate.

Figure 3:
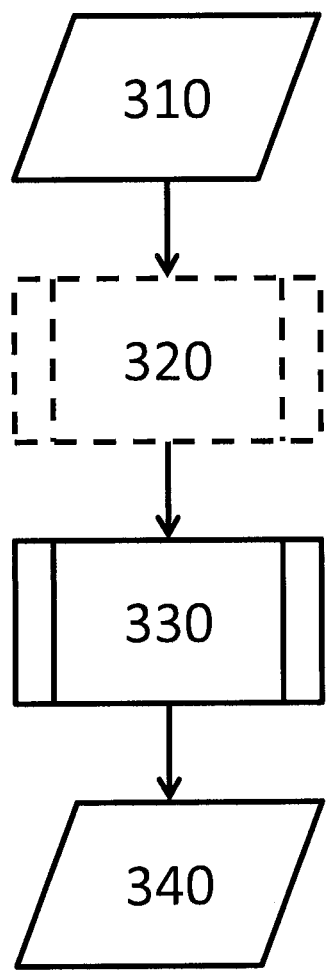
FIG. 3 schematically shows a flow chart for a method of making a decision, without reconstruction, based on measurement data from a lithography process, a lithography apparatus or a substrate processed thereby, according to an embodiment.

A method as disclosed herein according to an embodiment may be used to achieve similar functions without reconstruction, i.e., without determination of the values of the one or more characteristics of the lithography process or of the substrate. FIG. 3 schematically shows a flow chart for such a method. In 320, dimensions of data 310 of a measurement are optionally reduced. The data 310 may be multi-dimensional. For example, in diffraction based overlay measurement, the data 310 may include a series of intensities of diffraction peaks and each diffraction peak is a dimension. The dimensions of the data 310 may be reduced using an algorithm such as principal component analysis (PCA). PCA is a statistical procedure that orthogonally transforms possibly correlated dimensions of a set of multi-dimensional data into linearly uncorrelated dimensions. The uncorrelated dimensions are called principal components. The number of principal components is less than or equal to the number of dimensions of the original data. The principals may be sorted in such a way that the first principal component has the largest possible variance (i.e., accounting for as much of the variability in the original data as possible), and each succeeding principal component in turn has the highest variance possible under the constraint that it is orthogonal to the preceding components. The dimensions of the data 310 may be reduced by keeping only the several principal components with the largest variances and omitting the rest of the principal components. In 330, one or more statistical features 340 are determined from the data. For example, the one or more statistical features 340 may include the median, the mean, the variance, line edge roughness (LER), critical dimension uniformity (CDU), or a parameter of the probability distribution of the data. Another algorithm such as ICA (independent component analysis) and/or NNMF (non-negative matrix factorization) may be used to reduce the dimensions.

According to an embodiment, the one or more statistical features 340 include a mixture model fitted against the data. The mixture model may be represented by parameters of the mixture model. A mixture model is a probabilistic model for representing the presence of subpopulations within an overall population of data, without requiring knowledge of the sub-populations to which the data belong. A mixture model may be used to make statistical inferences about the properties of the sub-populations given only the overall population, without knowledge of the subpopulations to which the data belong. A mixture model can be written as a probability distribution of the overall population in a form of a weighted sum of component distributions. Each of the component distributions may be a probability distribution of a subpopulation. In mathematical form, a mixture model is $$\sum_i w_i P_i(\{\theta_i\})$$

where $P_i$ is a component distribution with a set $\theta_i$ of parameters and $w_i$ is a weight for $P_i$. The mixture model may be represented by a set $\{\theta\}$ of parameters where $\{\theta\}=\{w_i\} \cup (\cup_i \{\theta_i\})$. The set $\{\theta\}$ may be obtained from the data using a suitable algorithm. Examples of such an algorithm include expectation maximization (EM), Markov chain Monte Carlo (MCMC), moment matching, and/or the spectral method. EM can determine $\{\theta\}$ with an a priori given number of component distributions. MCMC deduces $\{\theta\}$ using posterior sampling as indicated by the Bayes' theorem. Other possible algorithms include variational Bayes, Laplace posterior approximations, and/or expected propagation. The set pf parameters $\{\theta\}$ may be random variables, and prior distributions will be placed over the parameters $\{\theta\}$. The parameters $\{\theta\}$ may be viewed as a random vector drawn from a Dirichlet distribution and the parameters $\{\theta\}$ will be distributed according to their respective conjugate priors. The number of component distributions can dynamically be determined from the data using a method such as the Dirichlet process.

Figure 4A:
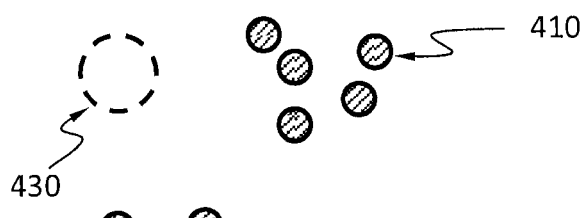
FIG. 4A, FIG. 4B and FIG. 4C schematically show a simple example of a mixture model and how the parameters of the mixture model are obtained from an overall population of data, using an iterative algorithm like EM.
Figure 4A:
Figure 4B:
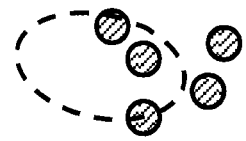
Figure 4B:
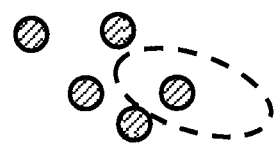
Figure 4C:
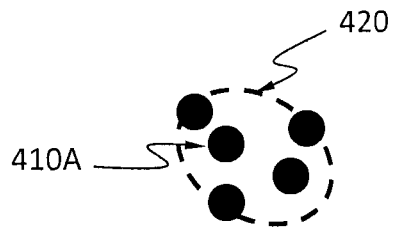
Figure 4C:
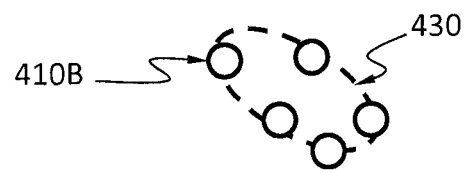

FIG. 4A, FIG. 4B and FIG. 4C schematically show a simple example of a mixture model and how the parameters of the mixture model are obtained from an overall population of data 410, using an iterative algorithm like EM. This mixture model has two component distributions 420 and 430, each of which is a bivariate Gaussian distribution. The covariance of each bivariate Gaussian distribution is represented by a dotted ellipse. FIG. 4A shows the mixture model with the initial values of the parameters of the mixture model. FIG. 4B shows an intermediate iteration of the iterative algorithm where the mixture model better represents the distribution of the overall population than the mixture model with the initial values of the parameters. FIG. 4C shows the result of the iterative algorithm where the mixture model better represents the distribution of the overall population reasonably well. In FIG. 4C, two clusters 410A and 420B of data 410 emerge.

Figure 5:
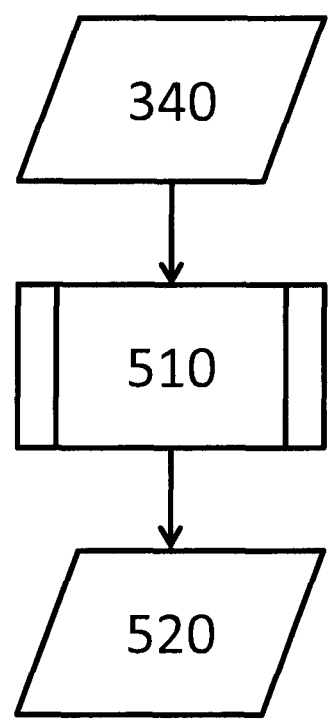
FIG. 5 schematically shows a flow for a method of using one or more statistical features.

FIG. 5 schematically shows a flow for a method of using the one or more statistical features 340, according to an embodiment. In 510, the one or more statistical features 340 are used to identify clusters 520 in the overall population. Data in the same cluster are more similar to each other in terms of the one or more statistical features 340 than to those in other clusters.

Figure 6:
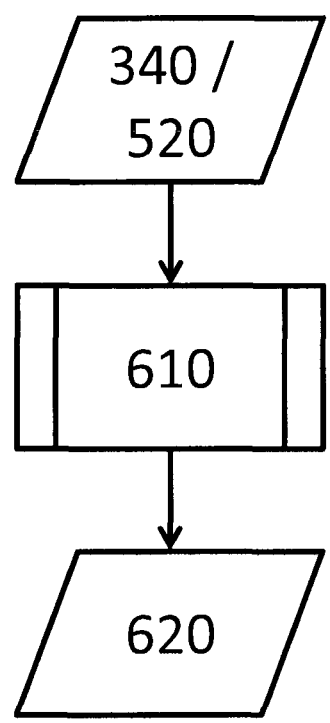
FIG. 6 schematically shows a flow for a method of using one or more statistical features.

FIG. 6 schematically shows a flow for a method of using the one or more statistical features 340, according to an embodiment. In 610, the one or more statistical features 340 of the overall population or the one or more statistical features of a cluster 520 in the overall population, are used as a training set to train a classifier 620. When the classifier 620 is applied on a datum not in the overall population or the cluster, the classifier 620 determines whether the datum belongs to the overall population or the cluster.

Figure 7:
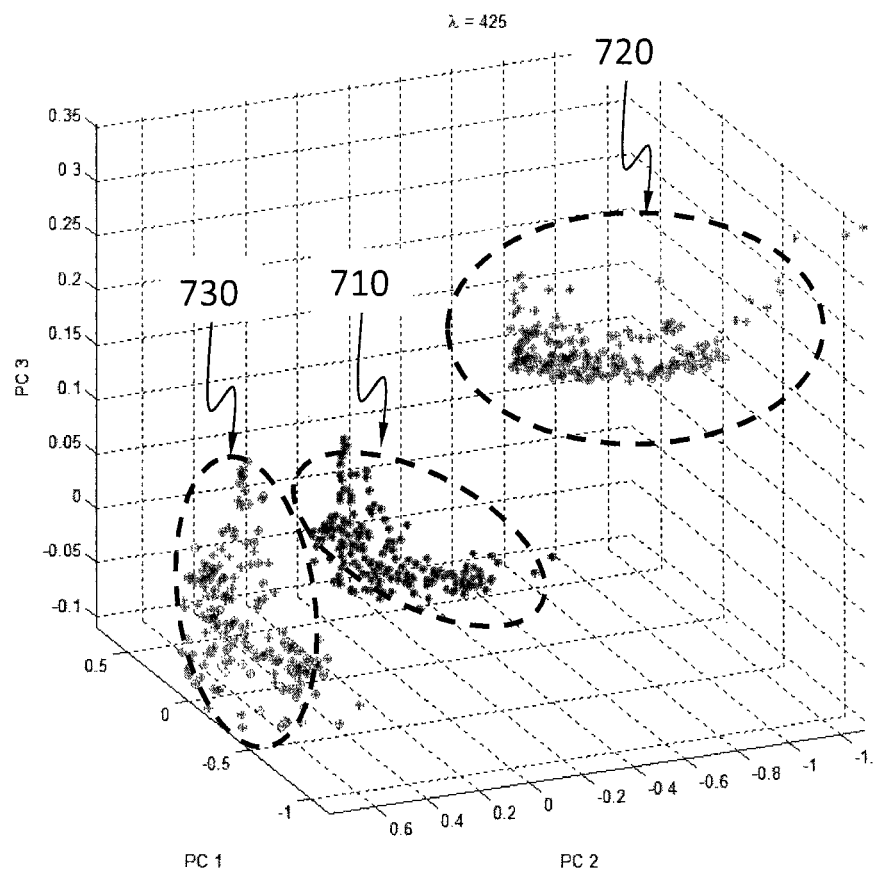
FIG. 7 shows an example where the one or more statistical features are used to train a classifier.

FIG. 7 shows an example where the one or more statistical features are used to train a classifier (e.g., support vector machine (SVM), logistic regression). The classifier can also be in a form of an interquartile range or a threshold on the estimated probability. In this example, the one or more statistical features include a CDU of a first group 710 of several patterns exposed under a certain dose. The CDU is used as the training set to train a classifier, which determines whether a datum obtained not from the first group 710 is similar to the first group. As a demonstration, the trained classifier is applied to a combination of a second group 720 of patterns, a third group 730 of patterns, and the first group 710 of patterns, where the second group 720 and the third group 730 are exposed at doses different from the dose under which the first group 710 is exposed. The classifier successfully determines that the second group 720 and third group 730 do not belong to the same class that the first group 710 belongs to. In this example, the dimensions of the data measured from the first group 710, the second group 720 and the third group 730 have been reduced to 20 by PCA. Three out of the 20 dimensions were used to plot the data in FIG. 7.

Figure 8:
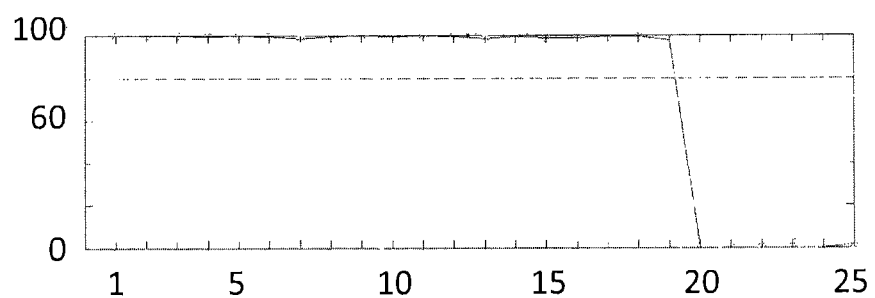
FIG. 8 shows an example where the one or more statistical features are used to train a classifier.

FIG. 8 shows an example where the one or more statistical features are used to train a classifier. The horizontal axis is the serial number of substrates processed by a lithography process. The vertical axis is the raw output of the classifier for each of the substrates. The data from the $1^{st}$ and $2^{nd}$ substrates were used as the training set to train the classifier. The classifier thus determines whether a new datum belongs to the same class as the $1^{st}$ and $2^{nd}$ substrates. The raw output of the classifier is from 0 to 100% similarity. If and only if the raw output of the classifier from a substrate is above 80% similarity, that substrate is classified as belonging to the same class as the $1^{st}$ and $2^{nd}$ substrates. In this example, the lithography process had a jump after the $19^{th}$ substrate was processed and before the $20^{th}$ substrate was processed. Therefore, the $1^{st}$ through the $19^{th}$ substrates should be classified as belonging to the same class as the $1^{st}$ and $2^{nd}$ substrates and the $20^{th}$ through the $25^{th}$ substrates should not. The raw output of the classifier indeed has a jump between the $19^{th}$ substrate and the $20^{th}$ substrate. The raw output of the $1^{st}$ through the $19^{th}$ substrates is close to 100%; the raw output of the $20^{th}$ through the $25^{th}$ substrates is close to 0. The classifier indeed successfully classifies these substrates as expected.

In an embodiment, there is provided a method comprising: determining, by a hardware computer system, one or more statistical features from data obtained from a lithography process, a lithography apparatus, or a substrate processed by the lithography process or the lithography apparatus, wherein determining the one or more statistical features does not comprise reconstructing a characteristic of the lithography process, of the lithography apparatus, or of the substrate. In an embodiment, the data have more than one dimension. In an embodiment, the method further comprises reducing dimensions of the data. In an embodiment, reducing the dimensions comprises using principal component analysis (PCA), independent component analysis (ICA) and/or non-negative matrix factorization (NNMF). In an embodiment, the data comprise a diffraction pattern from a target on a substrate. In an embodiment, the data comprise intensities of diffraction peaks obtained from the diffraction pattern. In an embodiment, the data comprise overlay errors or focus errors. In an embodiment, the one or more statistical features are selected from a group consisting of: the median of the data, the mean of the data, the variance of the data, line edge roughness (LER) of a pattern on the substrate, critical dimension uniformity (CDU) of a pattern on the substrate, a parameter of a probability distribution of the data, and any combination selected therefrom. In an embodiment, the one or more statistical features comprise a mixture model of the data. In an embodiment, determining the one or more statistical features comprises using expectation maximization (EM), Markov chain Monte Carlo (MCMC), moment matching, variational Bayes, Laplace posterior approximations, expected propagation and/or the spectral method. In an embodiment, at least one component distribution of the mixture model is a Gaussian distribution. In an embodiment, the one or more statistical features comprise a parameter of a mixture model. In an embodiment, the parameter comprises a parameter of a component distribution of the mixture model, or a weight of the component distribution of the mixture model. In an embodiment, determining the one or more statistical features comprises identifying one or more clusters from the data. In an embodiment, the method further comprises training a classifier with a cluster among the one or more clusters. In an embodiment, the method further comprises making a decision using the one or more statistical features. In an embodiment, the decision is selected from a group consisting of: whether a criterion is satisfied; whether the substrate is defective; whether a change has occurred in the lithography process, the lithography apparatus, or the substrate; whether the lithography process, the lithography apparatus or the substrate is similar to a reference process, apparatus or substrate; and any combination selected therefrom. In an embodiment, determining the one or more statistical features uses a Dirichlet process. In an embodiment, the method further comprises updating the one or more statistical features with additional data obtained from the lithography process, the lithography apparatus, and/or the substrate processed by the lithography process or the lithography apparatus. In an embodiment, the one or more statistical features comprise a support vector machine. In an embodiment, the support vector machine is single class.

In an embodiment, there is provided a computer program product comprising a computer readable medium having instructions recorded thereon, the instructions when executed by a computer implementing a method as described herein.

Figure 9:
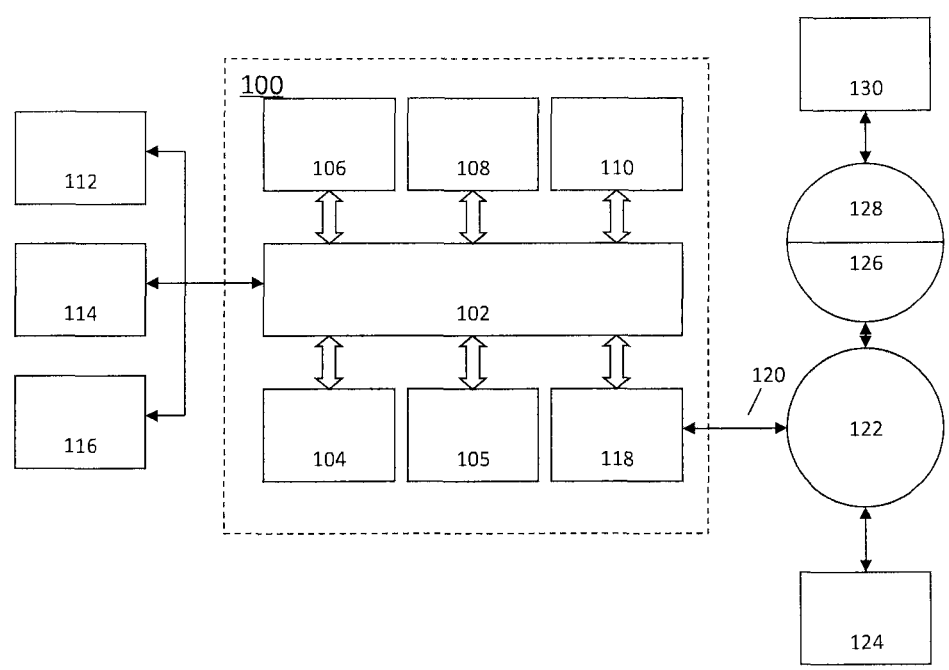
FIG. 9 is a block diagram of an example computer system.

FIG. 9 is a block diagram that illustrates a computer system 100 which can assist in implementing the methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for a process of an embodiment herein, for example. The received code may be executed by processor 104 as it is received, and/or stored in storage device 110, or other non-volatile storage for later execution. In this manner, computer system 100 may obtain application code in the form of a carrier wave.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the disclosure have been described above, it will be appreciated that the embodiments may be practiced otherwise than as described.

The invention claimed is:

1. A method comprising:
    obtaining measured data from a lithography process, a lithography apparatus, or a substrate processed by the lithography process or the lithography apparatus;
    determining, by a hardware computer system, one or more statistical features from the measured data, wherein determining the one or more statistical features is based on a form of the measured data used to determine one or more characteristics of the lithography process, of the lithography apparatus, or of the substrate from such measured data or based on data derived from that form of measured data, the derived data from the measured data being other than determined one or more characteristics from the measured data and other than data derived from determined one or more characteristics from the measured data; and
    determining a performance condition of the lithography process, the lithography apparatus, the substrate, or another substrate processed by the lithography process or the lithography apparatus based on the one or more statistical features, or based on data derived from the one or more statistical features, the derived data from the statistical features being other than determined one or more characteristics from the measured data and other than data derived from determined one or more characteristics from the measured data.

2. The method of claim 1, wherein the measured data have more than one dimension.

3. The method of claim 2, further comprising reducing dimensions of the measured data.

4. The method of claim 3, wherein reducing the dimensions comprises using principal component analysis (PCA), independent component analysis (ICA) and/or non-negative matrix factorization (NNMF).

5. The method of claim 1, wherein the measured data comprise data from a diffraction pattern from a target on a substrate.

6. The method of claim 5, wherein the measured data comprise intensities of diffraction peaks obtained from the diffraction pattern.

7. The method of claim 1, wherein the one or more characteristics comprise overlay error or focus error.

8. The method of claim 1, wherein the one or more statistical features are selected from a group consisting of: the median of the measured data or the data derived from the measured data, the mean of the measured data or the data derived from the measured data, the variance of the measured data or the data derived from the measured data, line edge roughness (LER) of a pattern on the substrate, critical dimension uniformity (CDU) of a pattern on the substrate, a parameter of a probability distribution of the measured data or the data derived from the measured data, and any combination selected therefrom.

9. The method of claim 1, wherein the one or more statistical features comprise a mixture model of the measured data or the data derived from the measured data.

10. The method of claim 9, wherein determining the one or more statistical features comprises using expectation maximization (EM), Markov chain Monte Carlo (MCMC), moment matching, variational Bayes, Laplace posterior approximations, expected propagation and/or the spectral method.

11. The method of claim 1, wherein the one or more statistical features comprise a parameter of a mixture model.

12. The method of claim 1, wherein determining the one or more statistical features comprises identifying one or more clusters from the measured data or the data derived from the measured data.

13. The method of claim 12, further comprising training a classifier with a cluster among the one or more clusters.

14. The method of claim 1, further comprising training a classifier with the measured data or the data derived from the measured data.

15. The method of claim 1, further comprising making a decision using the one or more statistical features or the data derived from the one or more statistical features.

16. The method of claim 15, wherein the decision is selected from a group consisting of:
whether a criterion is satisfied;
whether the substrate or another substrate is defective;
whether a change has occurred in the lithography process, the lithography apparatus, the substrate, or another substrate;
whether the lithography process, the lithography apparatus, the substrate, or another substrate is similar to a reference process, apparatus or substrate; and
any combination selected therefrom.

17. The method of claim 1, wherein determining the one or more statistical features uses a Dirichlet process.

18. The method of claim 1, further comprising updating the one or more statistical features with additional data obtained from the lithography process, the lithography apparatus, and/or the substrate processed by the lithography process or the lithography apparatus.

19. The method of claim 1, wherein the one or more statistical features comprise a support vector machine.

20. A non-transitory computer program product comprising a computer readable medium having instructions recorded thereon, the instructions, when executed by a computer system, configured to cause the computer system to at least:
obtain measured data from a lithography process, a lithography apparatus, or a substrate processed by the lithography process or the lithography apparatus;
determine one or more statistical features from the measured data, wherein determination of the one or more statistical features is based on a form of the measured data used to determine one or more characteristics of the lithography process, of the lithography apparatus, or of the substrate from such measured data or based on data derived from that form of measured data, the derived data from the measured data being other than determined one or more characteristics from the measured data and other than data derived from determined one or more characteristics from the measured data; and
determine a performance condition of the lithography process, the lithography apparatus, the substrate, or another substrate processed by the lithography process or the lithography apparatus based on the one or more statistical features, or based on data derived from the one or more statistical features, the derived data from the statistical features being other than determined one or more characteristics from the measured data and other than data derived from determined one or more characteristics from the measured data.

* * * * *